(12) United States Patent
Walter et al.

(10) Patent No.: US 7,776,653 B2
(45) Date of Patent: Aug. 17, 2010

(54) CONTROLLING FLIP-CHIP TECHNIQUES FOR CONCURRENT BALL BONDS IN SEMICONDUCTOR DEVICES

(75) Inventors: David N Walter, Dallas, TX (US); Duy-Loan T Le, Sugar Land, TX (US); Mark A Gerber, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/497,170

(22) Filed: Jul. 2, 2009

(65) Prior Publication Data

US 2009/0269883 A1    Oct. 29, 2009

Related U.S. Application Data

(62) Division of application No. 11/423,035, filed on Jun. 8, 2006, now Pat. No. 7,573,137.

(60) Provisional application No. 60/787,742, filed on Mar. 31, 2006.

(51) Int. Cl.
*H01L 21/44* (2006.01)
*H01L 21/48* (2006.01)
*H01L 21/50* (2006.01)

(52) U.S. Cl. ............. 438/109; 438/612; 438/617; 257/777

(58) Field of Classification Search ........... 438/109, 438/612, 617, 618; 257/777
See application file for complete search history.

(56) References Cited

U.S. PATENT DOCUMENTS

| 6,548,326 | B2 * | 4/2003 | Kobayashi et al. | 438/108 |
| 7,122,460 | B2 * | 10/2006 | Hua | 438/614 |
| 2006/0201704 | A1 * | 9/2006 | Heng et al. | 174/260 |

* cited by examiner

*Primary Examiner*—Thien F Tran
(74) *Attorney, Agent, or Firm*—Yingsheng Tung; Wade J. Brady, III; Frederick J. Telecky, Jr.

(57) ABSTRACT

A device has a first semiconductor chip (101) with contact pads in an interior first set (102) and a peripheral second set (103). A deformed sphere (104) of non-reflow metal such as gold is placed on each contact pad of the first and second sets. At least one additional deformed sphere (105) is placed on the first set pads, forming column-shaped spacers. The first chip is attached to a substrate (110) with a chip attachment location and a third set of contact pads (112) near the location. Low profile bond wires (130) span between the pads of the third set and the second set. A second semiconductor chip (140) of a size has a fourth set of contact pads (141) at locations matching the first set pads. The second chip is placed over the first chip so that the fourth set pads are aligned with the spacers on the matching first set pads, and at least one edge of the second chip overhangs the sphere on at least one pad of the second set. A reflow metal (142) bonds the spacers to the second chip, while the spacers space the first and second chips by a gap (105a) wide enough for placing the wire spans to the second set pads.

9 Claims, 4 Drawing Sheets

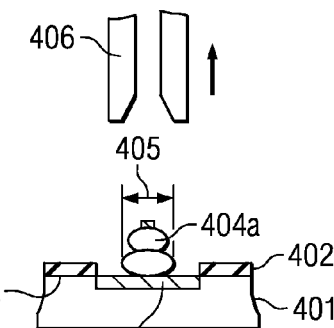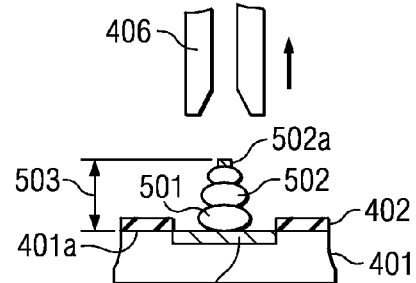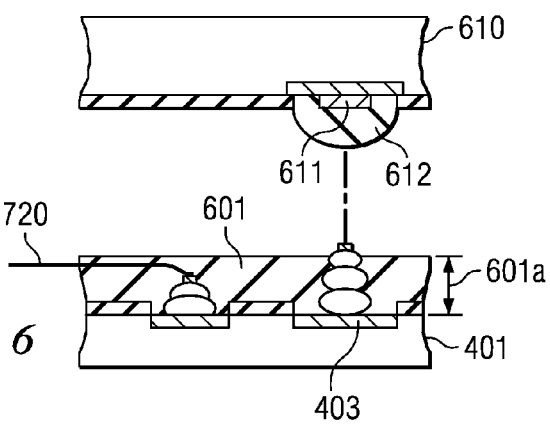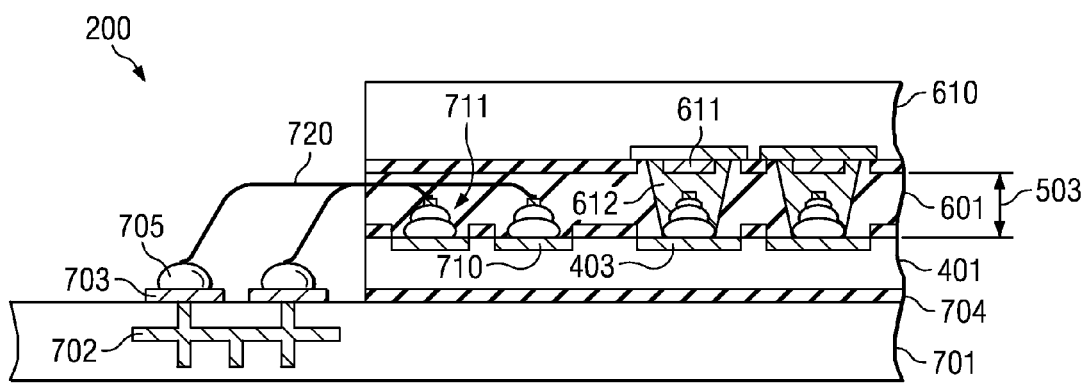

CONTROLLING FLIP-CHIP TECHNIQUES FOR CONCURRENT BALL BONDS IN SEMICONDUCTOR DEVICES

This application is a divisional of co-pending application Ser. No. 11/423,035, filed Jun. 8, 2006, which claims the benefit of provisional application No. 60/787,742 filed Mar. 31, 2006, the contents of which are herein incorporated by reference in its entirety.

FIELD OF THE INVENTION

The present invention is related in general to the field of semiconductor devices and processes, and more specifically to structure and processes of low profile packages for vertically integrated semiconductor systems.

DESCRIPTION OF THE RELATED ART

The long-term trend in semiconductor technology to double the functional complexity of its products every 18 months (Moore's "law") has several implicit consequences. First, the higher product complexity should largely be achieved by shrinking the feature sizes of the chip components while holding the package dimensions constant; preferably, even the packages should shrink. Second, the increased functional complexity should be paralleled by an equivalent increase in reliability of the product. Third, the cost per functional unit should drop with each generation of complexity so that the cost of the product with its doubled functionality would increase only slightly.

As for the challenges in semiconductor packaging, the major trends are efforts to shrink the package outline so that the package consumes less area and less height when it is mounted onto the circuit board, and to reach these goals with minimum cost (both material and manufacturing cost). Recently, another requirement was added to this list, namely the need to design packages so that stacking of chips and/or packages becomes an option to increase functional density and reduce device thickness. Furthermore, it is expected that a successful strategy for stacking chips and packages would shorten the time-to-market of innovative products, which utilize available chips of various capabilities (such as processors and memory chips) and would not have to wait for a redesign of chips.

Recent applications especially for hand-held wireless equipments, combined with ambitious requirements for data volume and high processing speed, place new, stringent constraints on the size and volume of semiconductor components used for these applications. Consequently, the market place is renewing a push to shrink semiconductor devices both in two and in three dimensions, and this miniaturization effort includes packaging strategies for semiconductor devices as well as electronic systems.

SUMMARY OF THE INVENTION

Applicants recognize the need for a fresh concept of achieving a coherent, low-cost method of shrinking semiconductor device packages both in two and in three dimensions, which includes device-stacking and package-on-package options for semiconductor devices as well as assembly options for flip-chip and wire bond interconnections. The device can be the base for a vertically integrated semiconductor system, which may include integrated circuit chips of functional diversity and passive components. The resulting system should have excellent electrical performance, mechanical stability, and high product reliability. Further, it will be a technical advantage that the fabrication method of the system is flexible enough to be applied for different semiconductor product families and a wide spectrum of design and process variations.

One embodiment of the invention is a semiconductor device with two semiconductor chips and a substrate, which may be another chip. The first semiconductor chip has a size, and an interior first set and a peripheral second set of contact pads at pad locations. A deformed sphere of non-reflow metal such as gold is placed on each contact pad of the first and second sets. At least one additional deformed sphere is placed on the first set pads, forming column-shaped spacers with a height. The first chip is attached to a substrate with a chip attachment location and a third set of contact pads near the location. Low-profile bond wires span between the pads of the third set and the second set. The second semiconductor chip of a size has a fourth set of contact pads at locations matching the first set pads. The second chip is placed over the first chip so that the fourth set pads are aligned with the spacers on the matching first set pads, and at least one edge of the second chip overhangs the sphere on at least one pad of the second set. A reflow metal bonds the spacers to the second chip, while the spacers space the first and second chips by a gap wide enough for placing the wire spans to the second set pads.

Another embodiment of the invention is a method for fabricating a stacked semiconductor device. A first semiconductor wafer has an active surface with devices having an interior first set and a peripheral second set of contact pads; the wafer receives adhesive material on its passive surface and is then singulated into discrete first chips of a certain size.

Next, a substrate with a chip attachment location and a third set of contact pads near the location receives a first chip attached. A gold ball is placed and squeezed on each chip contact pad of the first and second sets. The ball placing and squeezing is repeated for the pads of the first set to create column-shaped spacers of a certain height. Bonding wires span low profile between the pads of the second and the third sets to connect the first chip and the substrate.

For some embodiments it is advantageous to deposit a polymer precursor material over the first chip in a height about equal to the spacer height to protect the wire bond on the second set pads.

Next, a second semiconductor wafer is provided with devices having a fourth set of contact pads at locations matching the first pad set. Reflow metal such as tin alloy may be applied to the fourth set pads, before the second wafer is singulated into discrete second chips having a second size.

A second chip is placed over the first chip, aligning the fourth set pads with the spacers on the matching first set pads so that at least one edge of the second chip overhangs the ball on at least one pad of the second set. Thermal energy is applied to reflow the metal on the fourth set pads for bonding the spacers to the second chip so that the first and the second chip are electrically connected.

It is advantageous for some embodiments to include the additional process step of encapsulating the wire bonds in a protective compound. Another step may include the attachment of reflow bodies to the substrate to provide solder connection to external parts.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 4 to 7 illustrate schematically the significant steps of the fabrication process of the spacer and the device assembly.

FIG. 4 shows schematically the squeezed sphere of a free air ball attached to a chip contact pad.

FIG. 5 shows schematically the formation of a column-shaped spacer fabricated by two squeezed free air balls on a chip contact pad.

FIG. 6 shows schematically the alignment of two chips; one chip has a contact pad used for wire bonding and another contact pad used for a column-shaped spacer.

FIG. 7 shows schematically the stacked device after the process step of reflowing the solder on the second chip to bond to the spacers of the first chip, while keeping the two chips spaced by the height of the spacers wide enough for accommodating the wire spans of the wire-bonded contact pads.

DETAILED DESCRIPTION OF THE PREFERRED EMBODIMENTS

Figure 1:
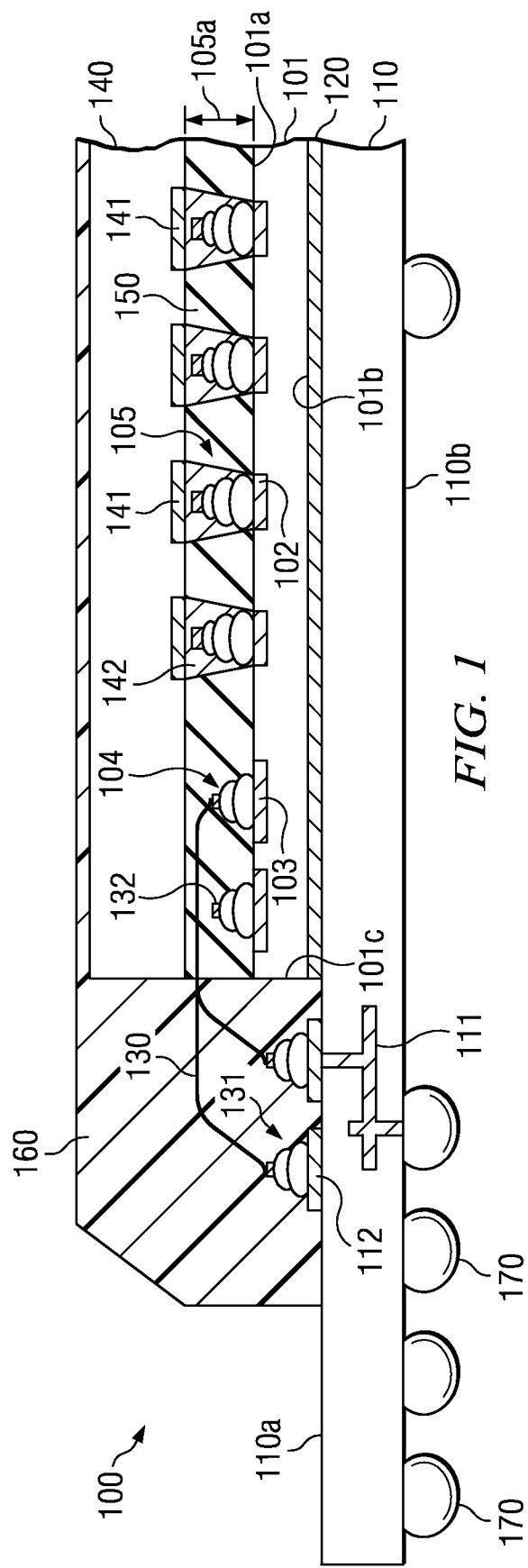
FIG. 1 illustrates a schematic cross section of a device with a first semiconductor chip having one set of contact pads for wire bonding to a substrate, and another set of contact pads with spacers allowing the flip-assembly of an about equally-sized second chip while controlling the spacing gap between the chips.

FIG. 1 illustrates a portion of an assembled semiconductor device, generally designated 100, which includes semiconductor chips stacked on a substrate by the invented combination of assembly techniques. The first semiconductor chip is designated 101; it has an active surface 101a, which includes the devices and circuits, a passive surface 101b, and a perimeter 101c. First chip 101 has a certain size, but FIG. 1 shows only the chip portion in the neighborhood of the chip perimeter. The active surface of first chip 101 has a first set of contact pads 102 located in the interior portion of the chip, and a second set of contact pads 103 located in the peripheral portion of the chip.

As depicted in FIG. 1, the contact pads 103 of the second set have a deformed sphere 104 of non-reflow metal placed on the contact pads. The contact pads 102 of the first set have more than one deformed sphere placed on the contact pad so that the spheres form column-shaped spacers 105 with a certain height 105a.

As defined herein, the term reflow metal refers to metals or alloys, which melt at temperatures between about 150 and 320° C.; examples are solders made of tin or various tin alloys (containing silver, copper, bismuth, and lead). In contrast, the term non-reflow metal refer to metals or alloys, which melt at temperatures between about 900 and 1200° C.; examples are silver, gold, and copper. The preferred non-reflow metal is gold or a gold alloy; alternatively, it may be copper or a copper alloy.

Chip 101 is made of a semiconductor material such as silicon, silicon germanium, or gallium arsenide; for most embodiments, the preferred material is silicon. The active surface is preferably covered by one or more layers of an overcoat such as silicon nitride or silicon oxynitride for mechanical and moisture protection; the overcoats are not shown in FIG. 1. Windows in the overcoat expose portions of the chip metallization as contact pads (102, 103) at pad locations. In advanced high speed devices, the size of the windows has been reduced well below 50 to 70 µm squared.

The contact pads are preferably made of copper; alternatively, they may include aluminum or an aluminum alloy. The pads have a metallurgical surface composition amenable to wire bonding; examples are surfaces with a thin layer of aluminum or layers of nickel and gold. The insulating layers may more generally be solder masks; when they define the exposed metals 102 and 103 as shown in FIG. 1, the metal pads are often referred to as solder mask-defined metal pads.

The embodiment of FIG. 1 has a substrate 110 with a first surface 110a and a surface designated 110b opposite the first surface. The substrate may be another semiconductor chip. Alternatively, the substrate has an insulating base material integral with conductive lines and vias 111. On surface 110a is a location suitable for attaching a semiconductor chip and a third set of contact pads 112 near this location. In the configuration illustrated in FIG. 1, the contact pads 112 are referred to as non-soldermask defined metal trace (metal line). Preferably, trace 112 is copper, positioned on top surface 110a. Contact pads 112 have a metallurgical surface configuration amenable to wire bonding; examples are surfaces with a thin layer of aluminum or layers of nickel and gold.

As FIG. 1 shows, the passive surface 101b of chip 101 is attached to the substrate attachment location using layer 120 of chip attach material (preferably a compound based on polyimide or epoxy). Bond wires 130 (preferably gold) span the distance between the contact pads 112 of the third set and the contact pads 103 of the second set in order to electrically connect the substrate 110 and the first chip 101. As shown in FIG. 1, in the preferred structure the ball 131 is bonded to contact pad 112 and the stitch 132 is bonded to the deformed sphere 104 on contact pad 103 to form a low profile wire bond.

FIG. 1 indicates a portion of a second semiconductor chip 140 with a second size. In some products, the second size may be approximately equal to the size of first chip 101. Chip 140 has a central fourth set of contact pads 141 at locations matching the pads 102 of the first set. Contact pads 141 are preferably made of copper or a copper alloy and have a metallurgical surface configuration amenable to solder attachment. Reflow metal 142, such as tin or a tin alloy, is on contact pads 141.

In the stacked device 100 of FIG. 1, second chip 140 is placed over the first chip 101 so that the contact pads 141 of the fourth set are aligned with the spacers 105 on the matching pads 102 of the first set. Furthermore, at least one edge of the second chip overhangs the ball on at least one pad of the second set. In the embodiment of FIG. 1, the overhang of chip 140 stretches over the squeezed balls of two pads 103.

The reflow metals 142 on the fourth set pads are also bonded to the spacers 105; the second chip 140 is thus electrically connected to the first chip 101. Due to the height 105a of the spacers 105, determined by the number of deformed spheres placed on top of each other, first chip 101 and second chip 140 are spaced by a gap of width 105a. This width is wide enough to accommodate the low profile wire bond on pads 103. The height 105a of the spacers and thus the width 105a of the gap are selected to satisfy the space needs of the bonding technique employed for creating the low profile bond connection.

Preferably, the deformed spheres forming the spacer have about equal size. It is also preferred to have the spacer attached to its contact pad 102 substantially normal to the surface of first chip 101 and extend from its contact pad 102 toward the matching pad 141 of chip 140.

As illustrated in FIG. 1, many device embodiments benefit from having a polymer material 150 fill the gap width 105a between first chip 101 and second chip 140. This polymer underfill material serves two purposes: It protects the stitch attach 132 of wires 130 onto the deformed spheres 104, and it reduces thermo-mechanical stress on spacers 105 and the solder joint contact pads 141. By selecting an epoxy- or polyimide-based precursor compound of known fluid-mechanical properties (such as viscosity and capillary flow characteristics), the polymerized polymer 150 can fill gap width 105a substantially without voids.

FIG. 1 further depicts an encapsulation material 160 protecting contact pads 112 and the connecting bond wires 130. Preferably, this encapsulation material is an epoxy-based molding compound fabricated by a transfer molding technique.

As shown in FIG. 1, device 100 preferably has reflow bodies 170 attached to surface 110b (opposite to surface 110a) of substrate 110 to provide connection to external parts. Preferably, these reflow bodies include solders such as tin or a tin compound. The reflow temperature of the solder compound 170 is preferably lower than the reflow temperature of reflow metal 142.

Figure 2:
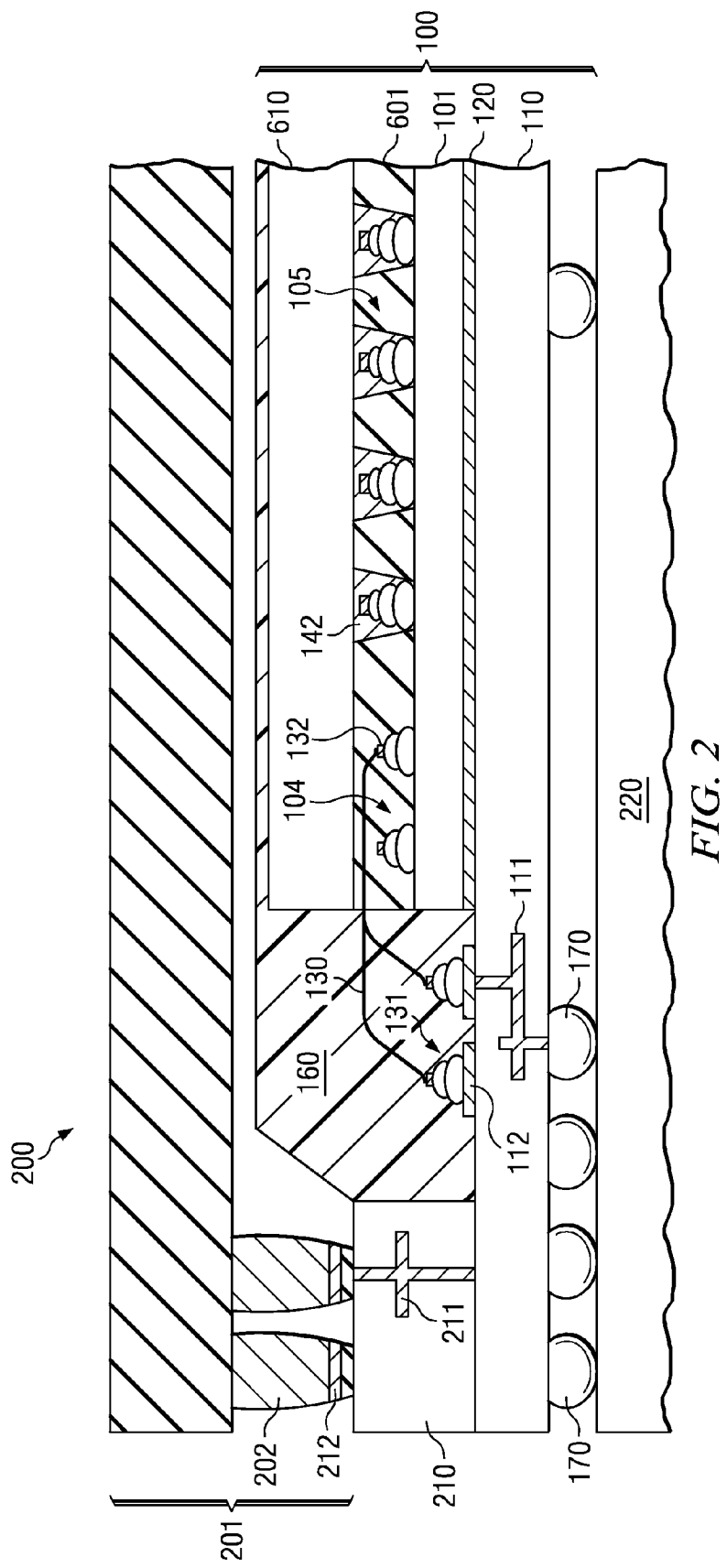
FIG. 2 is a schematic cross section of an electronic system, which includes the semiconductor device of FIG. 1 in combination with another device flip-assembled on the semiconductor device.

FIG. 2 depicts an embodiment, which is an electronic system generally designated 200 including the semiconductor device 100 of FIG. 1 in combination with another device 201 flip-assembled onto semiconductor device 100. In this example, the substrate of device 100 is configured in two parts: the first part is substrate 110 described in FIG. 1; the second part 210 forms a retainer wall for encapsulation compound 160. Part 210 has an insulating base material integral with conductive lines 211. On part 210 are contact pads 212 with a metallurgical surface configuration suitable for solder attachment. Device 201 has reflow bodies 202 in locations matching the contact pads 211.

In FIG. 2, reflow bodies 170 of device 100 are attached to external part 220.

Figure 3:
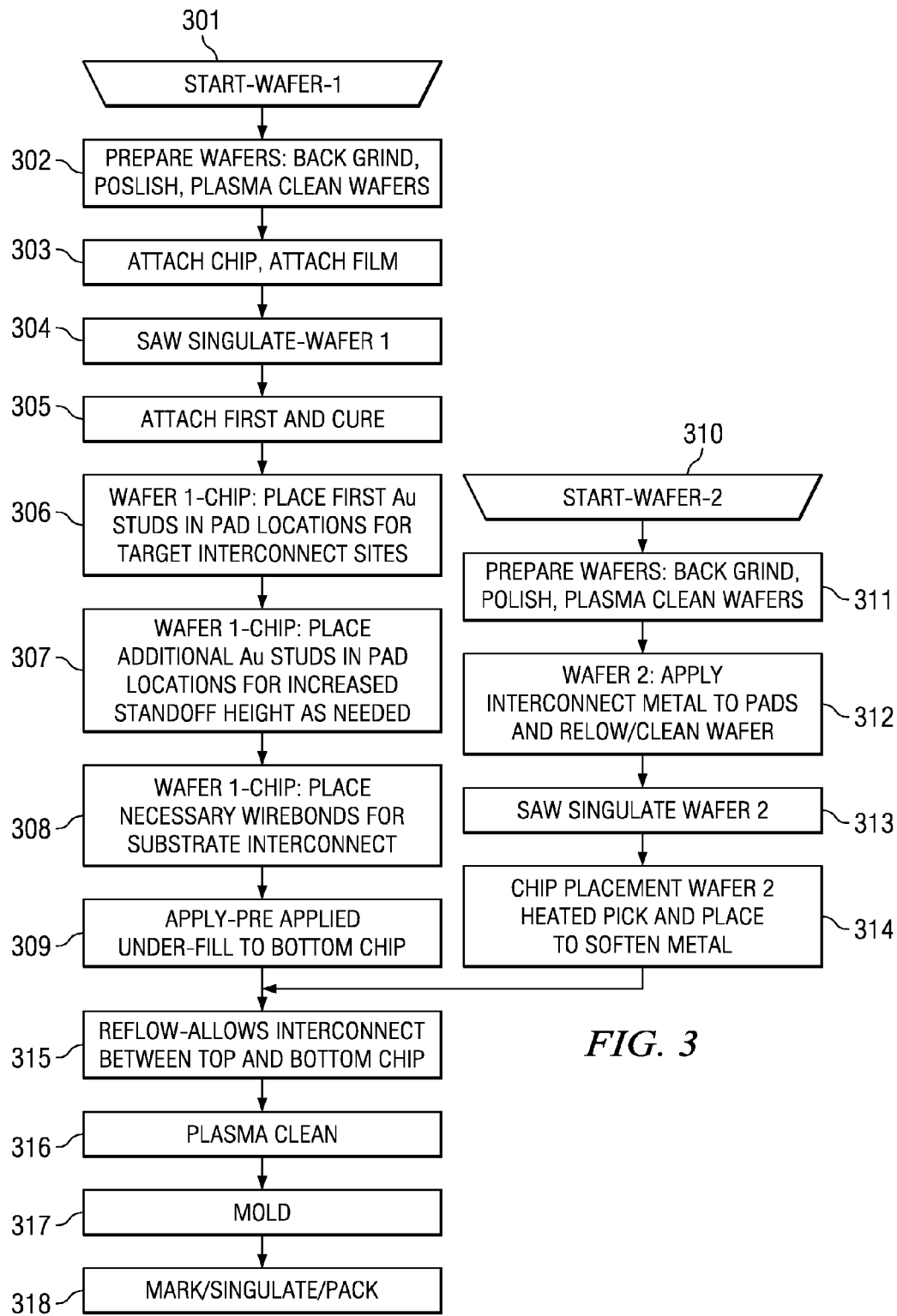
FIG. 3 shows a schematic block diagram of certain process flow steps for fabricating a device with stacked chips as illustrated in FIG. 1; the process flow combines wire bond and flip assembly techniques by means of controlling the gap between the assembled chips.

Another embodiment of the present invention is a method for fabricating a semiconductor device. The process flow is schematically depicted in FIG. 3, and significant steps of the process flow are illustrated in FIGS. 4 to 7. The method starts in step 301 by providing a first semiconductor wafer with an active and a passive surface, the active surface including devices with an interior first set and a peripheral second set of contact pads. Step 302 summarizes the wafer preparation techniques of back grinding, polishing, and plasma cleaning after the completion of the device fabrication.

In step 303, adhesive material is attached onto the passive surface (for instance, as a film, or by a spin-on technique). In step 304, the first wafer is singulated into discrete first chips, which have a certain size. The preferred singulation technique is sawing.

A substrate is then provided, which has a first surface with an attachment location and a third set of contact pads surrounding the location. A portion of the substrate is shown in FIG. 7 and designated 701. The substrate may be another semiconductor chip, or may have an insulating base material integral with conductive lines and vias, designated 702 in FIG. 7; the contact pads of the third set are designated 703. Preferably, the third set pads are made of copper and have a surface amenable to wire bonding, preferably a layer of gold.

In step 305, the adhesive surface of a first chip is attached onto the attachment location of the substrate using am epoxy-based or a polymer-based chip attach material (704 in FIG. 7); the attachment polymer is subsequently cured.

In step 306, a ball of a non-reflow metal such as gold or copper is placed on each contact pad of the first and second sets, and squeezed; this process step is illustrated in FIG. 4. A portion of the first chip 401 is shown with active surface 401a, covered by a protective overcoat 402. Windows in overcoat 402 provide access to device metallization 403 as contact pads; the windows thus delineate the contact pad locations. Metallization 403 is preferably made of a copper alloy, which has in the window a surface configuration suitable for wire bonding; the copper may have a surface layer of an aluminum alloy suitable for gold wire bonding, or a stack of a nickel layer followed by a top gold layer (these surface layers are not shown in FIG. 4).

A first free air ball 404, formed on an automated wire bonder, is pressed against the contact pad 403 of device 401 and is somewhat flattened. The diameter 405 may be in the range from about 15 to 120 µm. In this embodiment, the free air ball is made from a bonding wire, which is an alloy rich in gold, yet hardened by mixtures with a small percentage of copper and other metals. In a customary automated wire bonder, the wire (diameter between preferably between about 15 and 90 µm) is strung through a capillary 406. At the tip of the wire, a free air ball or sphere is created using either a flame or a spark technique. The ball has a typical diameter from about 1.2 to 1.6 times the wire diameters. The capillary is moved toward the metal pad 403 and the ball is pressed against the metal pad. The compression (also called Z- or mash) force is typically between about 17 and 75 g. At time of pressing, the temperature usually ranges from 150 to 270° C. The flame-off tip of the squeezed ball is designated 404a; it is facing outwardly from the device surface 401a.

In process step 307, the ball placing and squeezing for the pads of the first set is repeated to create column-shaped spacers of a height 503. This step is illustrated in FIG. 5, where a second ball 502 of a size about equal to the first ball is pressed on top of the first ball (now squeezed and designated 501) in a substantially linear sequence by automated wire bonding techniques, preferably so that the center-to-center line is approximately normal to the equatorial plane of the balls. Slight deviations from the vertical arrangement can be tolerated.

The ball-forming and placing may be repeated to create a column-shaped spacer on the contact pads of the first set with a height 503 based on the fluid mechanics of the selected gap-filling material and the gap width required for the device-to-be-created, when another chip is flipped onto the first chip (see below) and space for accommodating wire bonds needs to be reserved. The flame-off tip 502a points outwardly from the attachment surface 401a.

The repeated placings produce spacers of about the same height so that after assembling the stacked device, the first and the second chip are spaced by substantially uniform distance.

The next process step 308, depicted in the bottom portion of FIG. 7, provides the electrical connection between the first chip 401, assembled on the substrate 701, and the third set pads 703 on substrate 701. A ball bond 705 is placed on contact pads 703, and a stitch bond on the squeezed balls 711 on the second set pads 710 of chip 401, thus spanning bond wires 720 between the pads 710 of the second set and pads 703 of third set. It is preferred that wires 720 form shallow angles with balls 711 at the stitch sites.

It is desirable for some device applications to insert as the next step 309, as illustrated in the bottom portion of FIG. 6, the process of depositing a polymer precursor material 601 over the active surface of the first chip 401 in a height 601a about equal to the spacer height. After polymerization, the polymer material protects the stitch bonds on the second set pads and will, after multi-chip assembly, reduce thermo-mechanical stress at the solder joints.

In step 310, a second semiconductor wafer is provided, which includes devices with a central fourth set of contact pads at locations matching the first pad set. Step 311 summarizes the wafer preparation techniques of back grinding, polishing, and plasma cleaning after completion of the device fabrication.

In step 312, reflow metal is applied to the pads of the fourth set. In step 313, the second wafer is singulated into discrete second chips having a size approximately equal to the first chip size. The preferred singulation technique is sawing.

As illustrated in the top portion of FIG. 6, step 314 places a second chip 610 over the first chip 401 and aligns the fourth set pads 611 with the spacers on the matching first set pads 403; this alignment is indicated in FIG. 6 by the central line through pad 403 and 611. The reflow metal on pad 611 is designated 612 in FIG. 6. In the process of alignment, at least one edge of the second chip overhangs the ball on at least one pad of the second contact pads.

The next process step 315 provides the electrical connection between the second chip 610 and the first chip 401. As illustrated in the top portion of FIG. 7, thermal energy is applied to reflow the metal 612 on the fourth set pads 611; the metal is wetting the spacers on the first set pads 403 and thus bonding the spacers to the second chip. While the first and the second chip are thus electrically connected, they are spaced by the height 503 of the spacers wide enough for accommodating the wire spans to the second set pads 710.

As FIG. 7 shows, the polymer material 601 fills the gap width 503 after cooling to ambient temperature. In process step 316, the stacked device is plasma cleaned. Thereafter the device may be encapsulated, preferably in molding compound (not shown in FIG. 7, but illustrated in FIG. 1), so that the wire bonds and at least a portion of the substrate are protected by the encapsulation material.

The assembly process flow may further include the step of attaching reflow bodies to the substrate surface opposite its first surface to provide connection to external parts. The melting temperature of the reflow bodies are preferably lower than the melting temperature of the reflow metal employed on the fourth set pads.

The process flow concludes with step 318 by symbolizing and singulating the molded packages.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the embodiments are effective in semiconductor devices and any other device with contact pads, which have to undergo assembly on a substrate or printed circuit board followed, including the process of underfilling the gap between device and substrate. As another example, the semiconductor devices may include products based on silicon, silicon germanium, gallium arsenide and other semiconductor materials employed in manufacturing. As yet another example, the concept of the invention is effective for many semiconductor device technology nodes and not restricted to a particular one.

It is therefore intended that the appended claims encompass any such modifications or embodiments.

We claim:

1. A method for fabricating a semiconductor device, comprising the steps of:
    providing a first chip having an active and a passive surface, the active surface including devices and an interior first set of contact pads and a peripheral second set of contact pads;
    providing a substrate having a first surface with an attachment location and a third set of contact pads near the attachment location;
    attaching the passive surface of the first chip onto the attachment location of the substrate;
    pressing a first gold ball on the first and the second set of contact pads;
    pressing a second gold ball on the first pressed gold ball on the first set of contact pads to create column-shaped spacers;
    forming low profile stitch wire bonds on the pressed first gold balls on the second set of contact bond pads and spanning the wires to electrically connect the first chip and the substrate;
    providing a second semiconductor chip having a fourth set of contact pads matching the first set of contact pads and an edge;
    aligning the fourth set of contact pads of the second semiconductor chip to the spacers on the first set of contact pads and with the edge overhanging at least one low profile stitch wire bond; and
    applying thermal energy to reflow a solder metal for bonding the fourth set of contact pads to the spacers on the first set of contact pads, electrically connecting the first and the second chip.

2. The method according to claim 1 further including, before the aligning step, depositing a polymer precursor material over the active surface of the first chip, protecting the stitch wire bonds.

3. The method according to claim 1 further including encapsulating the stitch wire bonds and at least a portion of the substrate in a protective material.

4. The method according to claim 1 wherein the substrate is a third semiconductor chip.

5. The method according to claim 1 wherein the substrate has an insulating body integral with conductive lines and vias.

6. The method according to claim 1 wherein the gold ball is a free air ball in gold wire bonding.

7. The method according to claim 6 wherein the first gold balls and the second gold balls have similar size and are bonded together after the pressing steps to form a column-shaped spacer.

8. The method according to claim 7 wherein the spacers are of about the same height so that the first and the second chip are spaced by substantially uniform distance.

9. The method according to claim 1 further including the step of attaching reflow bodies to the substrate surface opposite its first surface to provide connection to external parts, the melting temperature of the reflow bodies lower than the melting temperature of the solder metal between the fourth set of contact pads and the spacers.

\* \* \* \* \*